(12) United States Patent
McNamara

(10) Patent No.: US 7,711,536 B2
(45) Date of Patent: May 4, 2010

(54) SYSTEM AND METHOD FOR VERIFICATION AWARE SYNTHESIS

(75) Inventor: Michael McNamara, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 978 days.

(21) Appl. No.: 11/324,169

(22) Filed: Dec. 30, 2005

(65) Prior Publication Data
US 2007/0156378 A1 Jul. 5, 2007

(51) Int. Cl.
*G06F 17/50* (2006.01)
*G06F 9/445* (2006.01)
(52) U.S. Cl. .................. 703/14; 716/5; 703/22
(58) Field of Classification Search ............. 703/14, 703/22, 24; 716/5
See application file for complete search history.

(56) References Cited

U.S. PATENT DOCUMENTS

| | | | |
|---|---|---|---|
| 6,591,403 B1 * | 7/2003 | Bass et al. ............ | 716/5 |
| 6,779,163 B2 | 8/2004 | Bednar et al. | |
| 6,820,240 B2 | 11/2004 | Bednar et al. | |
| 6,883,152 B2 | 4/2005 | Bednar et al. | |
| 6,975,976 B1 * | 12/2005 | Casavant et al. ............ | 703/14 |
| 7,313,772 B2 * | 12/2007 | Hekmatpour et al. ......... | 716/5 |
| 2005/0138585 A1 * | 6/2005 | Cerny et al. ................ | 716/5 |
| 2005/0149898 A1 | 7/2005 | Hakewill et al. | |
| 2007/0067751 A1 | 3/2007 | Seno | |

OTHER PUBLICATIONS

U.S. Appl. No. 11/324,004, filed Dec. 30, 2005, Knapp et al.
U.S. Appl. No. 11/324,029, filed Dec. 30, 2005, Watanabe et al.
U.S. Appl. No. 11/324,032, filed Dec. 30, 2005, Watanabe et al.

* cited by examiner

*Primary Examiner*—Thai Phan
(74) *Attorney, Agent, or Firm*—Stephen C. Durant

(57) ABSTRACT

A method of synthesis of a model representing a design of an integrated circuit is provided including associating a test environment with a first model representing a design of an integrated circuit; translating the first model of the design to a second model of the design; and automatically generating an adaptor that adapts the second model to the test environment.

24 Claims, 3 Drawing Sheets

Memory Select

Bank Sel | Line Select | Byte Select

Figure 2

SYSTEM AND METHOD FOR VERIFICATION AWARE SYNTHESIS

CROSS REFERENCE TO RELATED APPLICATIONS

This application relates to the following commonly assigned patent applications: System and Method for Synthesis Reuse, filed Dec. 30, 2005; System and Method for Generating a Plurality of Models at Different Levels of Abstraction from a Single Master Model, filed Dec. 30, 2005; and System and Method for Incremental Synthesis, filed Dec. 30, 2005, each of which is expressly incorporated herein in its entirety by this reference

BACKGROUND OF THE INVENTION

1. Field of the Invention

The invention relates in general to automated design of integrated circuits, and more particularly, to verification of integrated circuit designs at different levels of abstraction.

2. Description of the Related Art

Modern circuit design has evolved into a specialized field often referred to as electronic design automation in which computers and computer aided design (CAD) techniques are used to automate the integrated circuit (IC) design process. An IC design process typically begins with an engineer producing a high level design specification in terms of input/output signals, functionality and performance characteristics of a hardware circuit to be fabricated. These characteristics are captured in a high level hardware language model. This model may be decomposed into a plurality of sub-models, each of which is transformed to lower level abstraction models at the Register Transfer Level (RTL) for example. In the course of this transformation process, design choices are made among many possible detailed implementations.

Verification that a detailed design implementation produced from a high level design specification meets the functional requirements of the original design specification is a major issue in IC design. Various techniques have been developed to verify that a detailed model meets functional requirements of the original design specification. One approach involves the use of a testbench that includes a reference model, stimulus generator and output checker. The test bench effectively wraps around the model under test (e.g. an RTL model). The stimulus generator drives the model with stimulus signals, and the output checker checks the correctness of output from the model under test in response to the stimulus signals. The reference model is a computer program which calculates the correct results given any legal set of inputs. The output checker produces an error report if the design implementation does not meet the design specification. Another approach involves the use of assertions, a statement that some given property is required to hold and a directive to a verification tool to verify that the property does hold. A property may be a collection of logical and temporal relationships between and among boolean expressions, sequential expressions and/or other properties, which together represent some portion of behavior of a system. Formal verification involves the application of complex algorithms to test for properties in a design implementation.

Development of a testbench can be a time consuming, tedious and error prone activity. As a result, one shortcoming with the development of a testbench is a degree of uncertainty as to whether an error report produced during verification is due to an error in the design implementation or due to an error in the testbench. Thus, there has been a need for improvements in the production of verification environments to test whether a detailed implementation satisfies original design requirements. The present invention meets this need.

SUMMARY OF THE INVENTION

In one aspect a method of synthesis of a model representing a design is provided. A test environment is associated with a first model representing a design. The first model of the design is translated to a second model of the design. An adaptor is automatically generated that adapts the second model to the test environment.

BRIEF DESCRIPTION OF THE DRAWINGS

FIG. 2 is an illustrative drawing showing structures used in a verification environment in accordance with an embodiment of the invention and the memory access example to identify signals input model signals that are to be retained in the output model for verification purposes.

DETAILED DESCRIPTION OF THE PREFERRED EMBODIMENTS

The following description is presented to enable any person skilled in the art to make and use a system and method for verification aware synthesis of integrated circuits in accordance with the embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Thus, the present invention is not intended to be limited to the embodiments shown, but is to be accorded the widest scope consistent with the principles and features disclosed herein.

Figure 1:
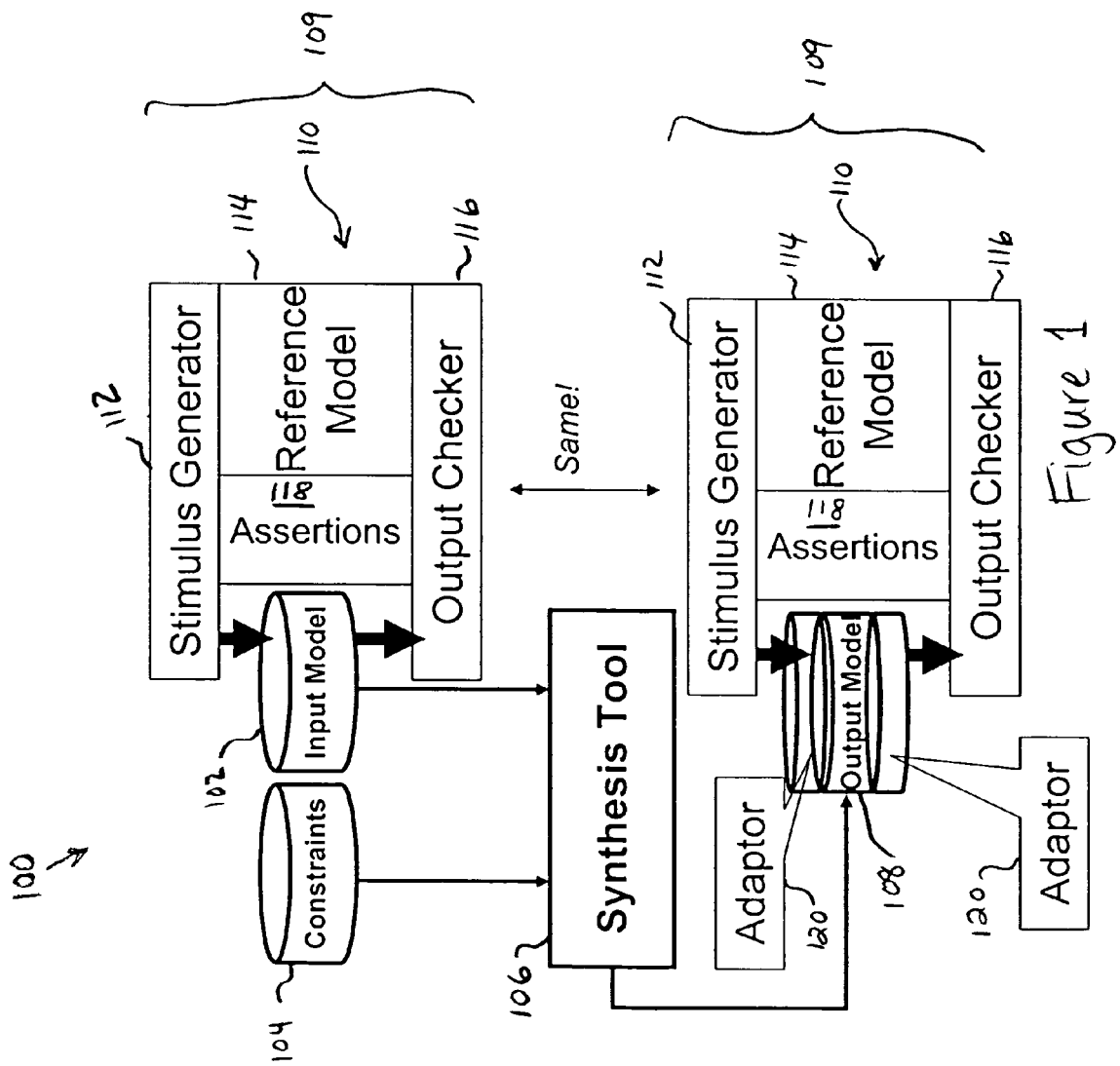
FIG. 1 is an illustrative flow diagram of a system and method process to automatically generate a verification environment in conjunction with generation of an output model from an input model.

FIG. 1 is an illustrative flow diagram of a process 100 to automatically generate a verification environment 109 in conjunction with generation of an output model 108 from an input model 102 and constraints 104 in accordance with one embodiment of the invention. An input model 102 describing an integrated circuit design, for example and a set of one or more constraints 104 are provided as inputs to a model translation system 106. The model translation system 106 automatically produces an output model 108 that comprises an implementation of the input model 102 that is compliant with the constraints but at a different level of abstraction.

A verification environment 109 including a test bench 110 (including a stimulus generator 112, reference model 114 and output checker 116) and assertions 118 used to verify that the input model 102 operates correctly, are associated with the input model. The same verification environment 109 including the same test bench 110 and assertions 118 are associated with the output model 108. An adaptor 120 produced by the model translation system 106 operates with the output model 108 to ensure that the verification environment 109 that operates with the input model 102 also operates with the output model 108.

In the System C language, for example, an adaptor comprises a channel, an object oriented communication structure that translates between models at different levels of abstraction. As used herein, "adaptor" includes a mechanism to enable communication between models or sub-models at different levels of abstraction.

The translation system 106 reads the test bench 110 and assertions 118 associated with the input model 102 and determines which signals in the input model are read or written by the verification environment 109. In order to ensure that the verification environment 109 originally developed to verify the function of the input model 102 also can be used to verify the operation of the output model 108, the translation system 106 ensures that signals exist in the output model 108 that are required by the verification environment 109 or creates adaptor code that can be used together with the output model 108 to rerun the same verification environment that was used to verify the input model 102.

For some signals, whose existence is otherwise needed in the new model, it is sufficient to simply ensure that the signals have the same name in the new model that they had in the input model. Note that as a usual practice in the art, the names of nearly all internal signals often are completely changed when a new model is created. For other signals, for which creating a new model involves breaking the signals down into sub-signals in order to facilitate an efficient translation, it is desirable for the preferred implementation to construct an assembly adaptor, which will rebuild the original signal from the various parts into which it has been dispersed.

As an example, consider the design of a subsystem designed to fetch data from a memory. Such a system must calculate the address of the item in memory, and then present this address to the memory system and issue the read command. One might include an assertion that verifies that the calculation is done properly, and that the signals have the correct values at the correct time. Such an assertion might look like: "ASSERT(BASE_ADDRESS+ OFFSET=MEMORY_ADDRESS)@posedge CLOCK" This requires that whenever a posedge clock event occurs (the instant when the value of the clock signal changes from 0 to 1) it must be the case that the value obtained when adding the signal BASE_ADDRESS to OFFSET be equivalent to the value held by the signal MEMORY_ADDRESS.

Now further, assume that the memory is 4 gigabytes in size, and is constructed of 4 different banks, each holding one gigabyte of overall memory. Also assume that the first bank holds the first portion of the memory, the second the next, and so on. Since 32 bits a common word with in computers, and is sufficient to address 4 gigabytes, let us assume that BASE_ADDRESS, OFFSET, and MEMORY_ADDRESS are all 32 bits in size. Given that there are four banks of memory, the top two bits of the calculated address will be user to select which bank shall be accesses to get the data from memory. Often memories are organized as a collection of lines, each holding many bytes; say for this case that each line holds 128 bytes.

Hence as a result of the above, the value of MEMORY_ADDRESS is actually used in parts: the top two bits are used to select the memory bank, the next 23 bits are used to select the line in a bank, and the final 7 bits are used to select the byte within the line. Note further that one typically must calculate and present to the system the bank select signal well before the line select or byte select is needed. Once the bank has been activated, the line select will be needed. In some systems the entire line will be transmitted by the bank, and the receiving system will then select the needed byte for return to the requestor, (such systems typically will make a local copy of the whole line, with the assumption that the requesting system quite likely will soon ask for other bytes located before or after this byte).

Taken together we see that an efficient implementation of this design will break apart the calculation of BASE_ADDRESS+OFFSET into perhaps three separate calculations— the top bits, the middle 23, and the lower 7—and present these values to the various systems at just the right time. Such a translation will have no need to ever assemble these three signals into one coherent whole, as there is no need to do so in order to effect correct operation, and extra unneeded work simply uses up time and space and power, and would make the computer slower and hotter than it needs to be. Moreover, there is no reason or ability to specify a coherent name for these internal pieces of the calculation in order to build a correct implementation, hence it is not done.

However, in order to verify the original assertion, it is necessary to create extra code that will reassemble a synthetic version of each of these three original signals. Thus, a system and method in accordance with an embodiment of the invention will recognize that these internal signals are important by examining the test bench environment, and where possible will ensure that they retain their original names, and where not possible will add adaptor code that will reassemble from the completely arbitrary names the pieces were assigned by the translation code in to a synthetic version, named as was the original, so that the assertion can again be tested.

FIG. 2 is an illustrative drawing showing structures used in the verification environment 109 in accordance with the memory access example to identify signals input model signals that are to be retained in the output model for verification purposes.

In one preferred embodiment, given (1) an input model which describes the functionality of the hardware to be created, in any of the many Hardware Description Languages in use, such as IEEE 1364 Verilog, IEEE 1076 VHDL, IEEE 1800 System Verilog, or IEEE 1666 SystemC, for example, and (2) a set of assertions about the model written in an assertion language such as the IEEE P1850 PSL or IEEE P1800 System Verilog Assertions, for example, and/or (3) a test bench which drives the model, which is coded in any of the many test bench languages in use, such as IEEE 1647 e, IEEE 1800 System Verilog, for example, the model translation system 106 of FIG. 1 produces (1) an output model, which maps the functionality described in the input model to a precise format in a standard hardware description language, such as IEEE 1364.1 Verilog and/or IEEE 1076.6 VHDL, for example, while (2) transforming the assertions included with the original model into a new form that described the same properties in a manner where they could be used with the output model; and (3) preserving the ability of the original test bench to be used without any change with the output model.

CODE EXAMPLE

Consider the following example of input code, written in the IEEE 1666 SystemC Hardware Description Language:

```
class alu: public sc_module {
    ...
    SC_THREAD(adder);
    SC_THREAD(multiplier);
    ...
    void adder( ) {
        // psl assert rose(enable) ->next(!enable)
        while (true)
            if (ENABLE && OPCODE == ADD) {
                port_OUT = port_IN1.read( ) + port_IN2.read( );
            }
        }
    }
}
```

Such SystemC models are typically converted by a tool known as a synthesizer, to a more detailed specification, at a lower level of abstraction, known as an RTL model. The statement beginning with "//psl" introduces an assertion, coded in the IEEE 1850 Property Specification Language, in what otherwise is a model coded in SystemC. The "//" is the SystemC comment syntax, effectively hiding the PSL statement from SystemC synthesis tools.

The assertion transformation part of this invention, referred to as (2) above, has the synthesis tool read the PSL assertion encoded in the comment, understand how the assertion is connected to the design, and transform the assertion into an equivalent assertion, about the output RTL model, and include that transformed assertion in the output file. Conversely, the system might re-write the assertion as a number of assertions, one for each part of the signal as it has been broken up in the translation process.

As used in this context, "understanding" involves determining which signals in the assertion reference which signals in the design, by parsing the assertion, and mapping each reference in the assertion to the point in the design to which it refers. Then the signal in the design database is marked with the attribute indicating that there is an assertion that refers to this signal. When the output design is created, those signals marked with the attribute that an assertion refers to this signal, should the signal otherwise be needed in the output design, it is emitted with its original name. If the signal exists in the output design, albeit broken into many parts, the system might add to the adaptor code which would create a the original signal from these constituent parts.

The following is an example output model code created from the above input model code.

```
module alu (input enable, clock, reset;
    input [4:0] opcode;
    input [31:0] in1, in2;
    output [31:0] out);
    reg [5:0] state, next_state;    // state machine
    reg [31:0] r1, r2, o;           // intermediate values
    parameter s0 = 0, s1 = 1, s2 = 2, s3 = 3;
    always (@ posedge clock) begin
        if (reset) state = s0;
        else state = next_state;
    end
    always (@negedge clock) begin
        case (state)
            s0: if (enable && opcode == ADD)
                    next_state = s1;
            s1: begin
                    //psl assert (!enable)
                    r1 = in1;
                    r2 = in2;
```

```
                    next_state = s2;
                end
            s2: begin
                    o = r1 + r2;
                    next_state = s3;
                end
            s3: begin
                    out = o;
                    next_state = s0;
                end
        endcase
    end
endmodule
```

The model translation system 106 of FIG. 1, when it produced the above output model code, also inserted an equivalent PSL assertion, again, introduced by the comment syntax "//psl". The assertion is modified from the original, as the synthesizer understood that the original assert, which said that the signal ENABLE must change from TRUE to FALSE on the next cycle after the signal becomes true, and be expressed by asserting that the signal ENABLE must be FALSE whenever the state machine enters state s1. This is the case because the state machine goes to state s0 whenever the ENABLE signal becomes TRUE, and goes to the state s1 on the next cycle.

Note that often it is necessary to change the PSL assertion in order for it to work in the output design; at other times the assertion can be copied as is. All of the assertions in the original input model code are correctly preserved in the output model code, and hence remain a part of the program.

This transformation of assertions is achieved by (1) automatic identification of those signals in the design which are used as inputs to the PSL assertion, and (2) preservation or recreation of these signals in the output design such that the same name shall refer to the same signal. Taken together these two steps allow the use of the same PSL assertion to be used to measure whether that the output design satisfies the PSL assertion at all points of execution. Moreover, since these steps are performed automatically, there is no requirement of any significant effort by the user.

The test bench preservation part of this invention, referred to as (3) above, involves the model translation system 106 reading sufficient parts of the test bench used 110 understand how the test bench 110 operates with the input model (in particular what signals of the input model are driven by the test bench, and what signals of the input model are read from the design by the test bench), and when creating the output model, the model translation system 106 preserves these signals with their original names and meanings, enabling the original test bench to be used with the generated output model, while requiring no change to the test bench for this purpose.

Thus, a design team can create an input model for a design, verify the design by construction test benches that apply stimulus to the input model, and check the response of the design to the stimulus, and create assertions that check the internal timing and other behaviors of the input model when it is operating, and then, reuse these assertions and this test bench environment on the output model, without requiring hand modification of either the assertions 118 or the test bench 110.

This is of significant value because once any modification is made of the test framework, one can not be sure that the test framework is still valid. Therefore, users can be more confident that an output model is as correct as the input model from which it was produced, because users can apply the same tests of correctness to the output model that they applied to the input model.

Figure 3:
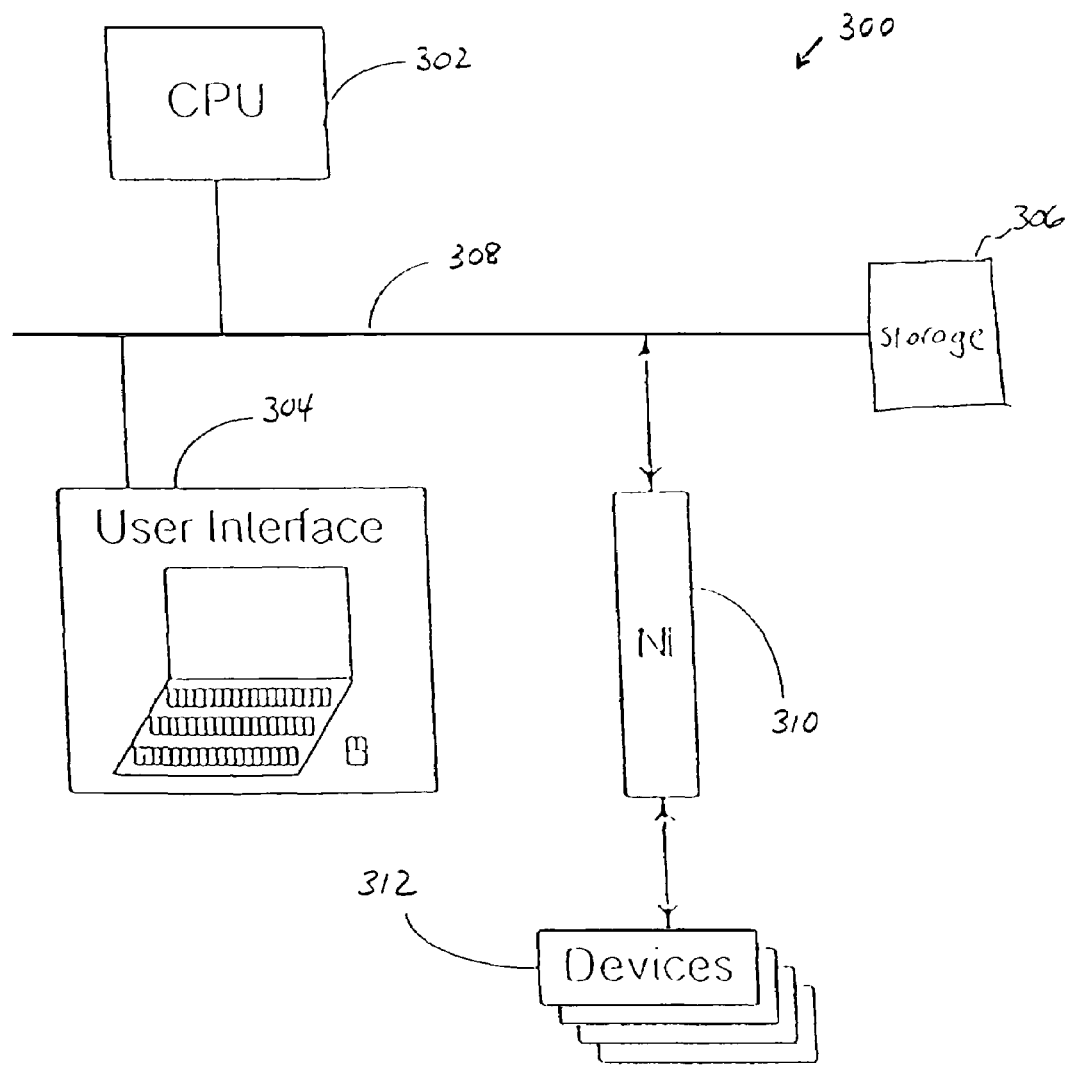
FIG. 3 is a schematic drawing of an illustrative computer system that can be programmed to implement a novel system and method of FIG. 1 in accordance with an embodiment of the invention.

FIG. 3 is a schematic drawing of an illustrative computer system 300 that can be programmed to implement a novel system and method of FIG. 1 in accordance with an embodiment of the invention. The computer system 300 includes one or more central processing units (CPU's) 302, a user interface 304, computer readable storage media 306, a system bus 308, and one or more bus interfaces for connecting the CPU, user interface, memory and system bus together. The computer system also includes a network interface 310 for communicating with other devices 312 on a computer network.

Computer readable input master models of FIG. 1 may be provided, via bus 308, from interface 304, storage 308 or other devices 312, to a verification aware synthesis tool in accordance with an embodiment of the invention running from storage 308 on the CPU 302. The synthesis tool is operative to translate an input model into a lower level abstraction output model with signals and an adaptor suitable to enable the output model to operate within the same verification environment used for the input model.

While the invention has been described herein with reference to various illustrative features, aspects and embodiments, it will be appreciated that the invention is susceptible of variations, modifications and other embodiments, other than those specifically shown and described. The invention is therefore to be broadly interpreted and construed as including all such alternative variations, modifications and other embodiments within its spirit and scope as hereinafter claimed.

The invention claimed is:

1. A method of synthesis of a model representing a design of an integrated circuit, the method comprising:
    associating a test environment with a first model representing a design of an integrated circuit;
    wherein the first model includes a first signal;
    translating the first model of the design to a second model of the design;
    wherein the second model includes multiple signal parts that correspond to the first signal;
    generating an adaptor that creates the first signal from the multiple signal parts so as to adapt the second model to the test environment.

2. The method of claim 1, wherein the second model is a Register Transfer Level (RTL) model.

3. The method of claim 1, wherein the first or second model is a hardware description language model.

4. The method of claim 1, further comprising:
    providing a set of assertions associated with the design; and
    translating the set of assertions along with the first model.

5. The method of claim 1, further comprising:
    providing a test bench associated with the first model; and
    using the test bench as the test environment.

6. The method of claim 1, wherein the set of assertions includes at least one assertion in the Property Specification Language (PSL).

7. The method of claim 4, wherein translating the set of assertions includes:
    determining a relationship between each assertion and the design; and
    transforming the assertion to an equivalent at a different level of abstraction of the design.

8. The method of claim 7, wherein the relationship is one of signals in the assertion to signals in the design.

9. The method of claim 1, wherein the adaptor operates to ensure that a verification environment associated with the test environment operates with the first and second models.

10. The method of claim 1, wherein the adaptor translates between the first and second model, the first and second models being at different levels of abstraction.

11. The method of claim 1, wherein the first model is associated with a first plurality of signals of the design, and the second model is associated with a second plurality of signals of the design, each signal in the first plurality relating to a plurality of signals in the second plurality.

12. The method of claim 1, wherein the first model describes functionality of the circuitry of the design.

13. An article of manufacture that includes a computer data storage device, encoded with code structure, when executed by a computer causes the computer data device to implement a method for synthesizing a model representing a design of an integrated circuit, the method comprising:
    associating a test environment with a first model representing a design of an integrated circuit;
    wherein the first model includes a first signal;
    translating the first model of the design to a second model of the design;
    wherein the second model includes multiple signal parts that correspond to the first signal;
    generating an adaptor that creates the first signal from the multiple signal parts so as to adapt the second model to the test environment.

14. The article of claim 13, wherein the second model is a Register Transfer Level (RTL) model.

15. The article of claim 13, wherein the first or second model is a hardware description language model.

16. The article of claim 13, wherein: a set of assertions is associated with the design; and the adaptor translates set of assertions along with the first model.

17. The article of claim 13, further comprising: a test bench associated with the test environment.

18. The article of claim 13, wherein the set of assertions includes at least one assertion in the Property Specification Language (PSL).

19. The article of claim 16, wherein translating the set of assertions includes:
    determining a relationship between each assertion and the design; and transforming the assertion to an equivalent at a different level of abstraction of the design.

20. The article of claim 19, wherein the relationship is one of signals in the assertion to signals in the design.

21. The article of claim 13, wherein the adaptor operates to ensure that a verification environment associated with the test environment operates with the first and second models.

22. The article claim 13, wherein the first and second models are at different levels of abstraction.

23. The article of claim 13, wherein the first model is associated with a first plurality of signals of the design, and the second model is associated with a second plurality of signals of the design, each signal in the first plurality relating to a plurality of signals in the second plurality.

24. The article of claim 13, wherein the first model describes functionality of circuitry of the design.

* * * * *

UNITED STATES PATENT AND TRADEMARK OFFICE
CERTIFICATE OF CORRECTION

PATENT NO. : 7,711,536 B2  Page 1 of 1
APPLICATION NO. : 11/324169
DATED : May 4, 2010
INVENTOR(S) : Michael McNamara It is certified that error appears in the above-identified patent and that said Letters Patent is hereby corrected as shown below:

In column 1, line 14, after "reference" insert -- . --.

In column 5, line 45, delete "a the" and insert -- the --, therefor.

In column 6, line 65, delete "can not" and insert -- cannot --, therefor.

In column 8, line 53, in Claim 22 after "article" insert -- of --.

Signed and Sealed this

Second Day of November, 2010

David J. Kappos
*Director of the United States Patent and Trademark Office*